US006346451B1

(12) United States Patent
Simpson et al.

(10) Patent No.: US 6,346,451 B1
(45) Date of Patent: Feb. 12, 2002

(54) LATERIAL THIN-FILM SILICON-ON-INSULATOR (SOI) DEVICE HAVING A GATE ELECTRODE AND A FIELD PLATE ELECTRODE

(75) Inventors: Mark Simpson, Ossining; Theodore Letavic, Putnam Valley, both of NY (US)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 09/343,912

(22) Filed: Jun. 30, 1999

Related U.S. Application Data

(63) Continuation-in-part of application No. 08/998,048, filed on Dec. 24, 1997.

(51) Int. Cl.[7] ............................................. H01L 21/331
(52) U.S. Cl. ...................... 438/311; 438/186; 257/134; 257/138; 257/139; 257/285; 257/287; 257/488
(58) Field of Search .................................. 438/311, 186; 257/488, 285, 287, 134, 138, 139

(56) References Cited

U.S. PATENT DOCUMENTS

| 4,394,182 A | | 7/1983 | Maddox, III ................. 148/1.5 |
| 5,246,870 A | | 9/1993 | Merchant ..................... 437/21 |
| 5,362,979 A | | 11/1994 | Merchant ..................... 257/340 |
| 5,412,241 A | | 5/1995 | Merchant ..................... 257/409 |
| 5,438,220 A | | 8/1995 | Nakagawa et al. .......... 257/487 |
| 5,528,397 A | | 6/1996 | Zavracky et al. ............. 359/59 |
| 5,583,369 A | | 12/1996 | Yamazaki et al. ........... 257/635 |
| 5,640,040 A | | 6/1997 | Nakagawa et al. .......... 257/487 |
| 5,705,424 A | | 1/1998 | Zavracky et al. ............. 437/86 |
| 5,736,750 A | | 4/1998 | Yamazaki et al. ............. 257/59 |
| 6,084,254 A | * | 6/1998 | Kim ............................. 257/134 |
| 5,830,787 A | | 11/1998 | Kim ............................. 438/163 |
| 5,973,341 A | * | 12/1998 | Letavic et al. .............. 257/287 |

FOREIGN PATENT DOCUMENTS

| EP | 0786818 A2 | 7/1997 |
| EP | 10-104659 | 4/1998 |
| EP | 10-233511 | 9/1998 |
| JP | 09-191111 | 7/1997 |
| WO | 9934449 A2 | 7/1999 |
| WO | 0036655 A1 | 6/2000 |

OTHER PUBLICATIONS

PHA 23,337, U.S. Serial No. 08/998,048, filed Dec. 24, 1997.
PHA 23,475, U.S. Serial No. 09/122,407, filed Jul. 24, 1998.

* cited by examiner

*Primary Examiner*—David Nelms
*Assistant Examiner*—Reneé R. Berry
(74) *Attorney, Agent, or Firm*—Steven R. Biren

(57) ABSTRACT

A lateral thin-film Silicon-On-Insulator (SOI) device includes a semiconductor substrate, a buried insulating layer on the substrate and a lateral transistor device in an SOI layer on the buried insulating layer and having a source region of a first conductivity type formed in a body region of a second conductivity type opposite to that of the first. A lateral drift region of a first conductivity type is provided adjacent the body region, and a drain region of the first conductivity type is provided laterally spaced apart from the body region by the drift region. A gate electrode is provided over a part of the body region in which a channel region is formed during operation and extending over a part of the lateral drift region adjacent the body region, with the gate electrode being at least substantially insulated from the body region and drift region by an insulation region. In order to provide improved breakdown voltage characteristics, a dielectric layer is provided over at least a part of the insulation region and the gate electrode, and a field plate electrode is provided over at least a part of the dielectric layer which is in direct contact with the insulation region, with the field plate electrode being connected to an electrode of the lateral transistor device.

11 Claims, 2 Drawing Sheets

LATERAL THIN-FILM SILICON-ON-INSULATOR (SOI) DEVICE HAVING A GATE ELECTRODE AND A FIELD PLATE ELECTRODE

This is a continuation-in-part of application Ser. No. 08/998,048, filed Dec. 24, 1997, which is herein incorporated by reference.

BACKGROUND OF THE INVENTION

The invention is in the field of Semiconductor-On-Insulator (SOI) devices, and relates more particularly to lateral SOI devices suitable for high-voltage applications.

In fabricating high-voltage power devices, tradeoffs and compromises must typically be made in areas such as breakdown voltage, size, "on" resistance and manufacturing simplicity and reliability. Frequently, improving one parameter, such as breakdown voltage, will result in the degradation of another parameter, such as "on" resistance. Ideally, such devices would feature superior characteristics in all areas, with a minimum of operational and fabrication drawbacks.

One particularly advantageous form of lateral thin-film SOI device includes a semiconductor substrate, a buried insulating layer on the substrate, and a lateral transistor device in an SOI layer on the buried insulating layer, the device, such as a MOSFET, including a semiconductor surface layer on the buried insulating layer and having a source region of a first conductivity type formed in a body region of a second conductivity type opposite to that of the first, an at least substantially insulated gate electrode over a channel region of the body region and insulated therefrom, a lateral drift region of the first conductivity type, and a drain region of the first conductivity type laterally spaced apart from the channel region by the drift region.

A device of this type is shown in FIG. 1 common to related U.S. Pat. No. 5,246,870 (directed to a method) and U.S. Pat. No. 5,412,241 (directed to a device), commonly-assigned with the instant application and incorporated herein by reference. The device shown in FIG. 1 of the aforementioned patents is a lateral SOI MOSFET device having various features, such as a thinned SOI layer with a linear lateral doping region and an overlying field plate, to enhance operation. As is conventional, this device is an n-channel or NMOS transistor, with n-type source and drain regions, manufactured using a process conventionally referred to as NMOS technology.

More advanced techniques for enhancing high-voltage and high-current performance parameters of SOI power devices are shown in U.S. patent application Ser. No. 08/998,048, of which the present application is a CIP, filed Dec. 24, 1997, commonly-assigned with the instant application and incorporated herein by reference. Yet another technique for improving the performance of an SOI device is to form a hybrid device, which combines more than one type of device configuration into a single structure. Thus, for example, in U.S. patent application Ser. No. 09/122,407, filed Jul. 24, 1998, commonly-assigned with the instant application and incorporated herein by reference, an SOI device is disclosed which includes a lateral DMOS transistor and an LIGB transistor in the same structure.

Thus, it will be apparent that numerous techniques and approaches have been used in order to enhance the performance of power semiconductor devices, in an ongoing effort to attain a more nearly optimum combination of such parameters as breakdown voltage, size, current-carrying capability and manufacturing ease. While all of the foregoing structures provide varying levels of improvement in device performance, no one device or structure fully optimizes all of the design requirements for high-voltage, high-current operation.

Accordingly, it would be desirable to have a transistor device structure capable of high performance in a high-voltage, high-current environment, in which operating parameters, and in particular breakdown voltage, are further optimized.

SUMMARY OF THE INVENTION

It is therefore an object of the present invention to provide a transistor device structure capable of high-performance in a high-voltage, high-current environment. It is a further object of the invention to provide such a transistor device structure in which operating parameters such as breakdown voltage are enhanced.

In accordance with the invention, these objects are achieved in a lateral thin-film SOI device structure of the type described above in which a dielectric layer is provided over at least a part of the insulation region and the gate electrode, and a field plate electrode is provided over at least a part of the dielectric layer which is in direct contact with the insulation region, with the field plate electrode being connected to an electrode of the lateral transistor device.

In a preferred embodiment of the invention, the total thickness of the dielectric layer plus the insulation region (i.e. the total "top" insulation thickness) is about equal to the thickness of the buried insulation layer. Typically, the total thickness of the dielectric layer plus the insulation region, and also the thickness of the buried insulation, will each be at least above two microns, and preferably at least about three microns.

In further preferred embodiments of the invention, the gate electrode extends over about one-half of the lateral drift region, and the field plate electrode is connected to either the gate electrode or the source electrode of the lateral transistor device.

Lateral thin-film SOI devices in accordance with the present invention offer a significant improvement in that a combination of favorable performance characteristics making the devices suitable for operation in a high-voltage, high-current environment, and in particular high breakdown voltage, can be achieved.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which.

Figure 1:
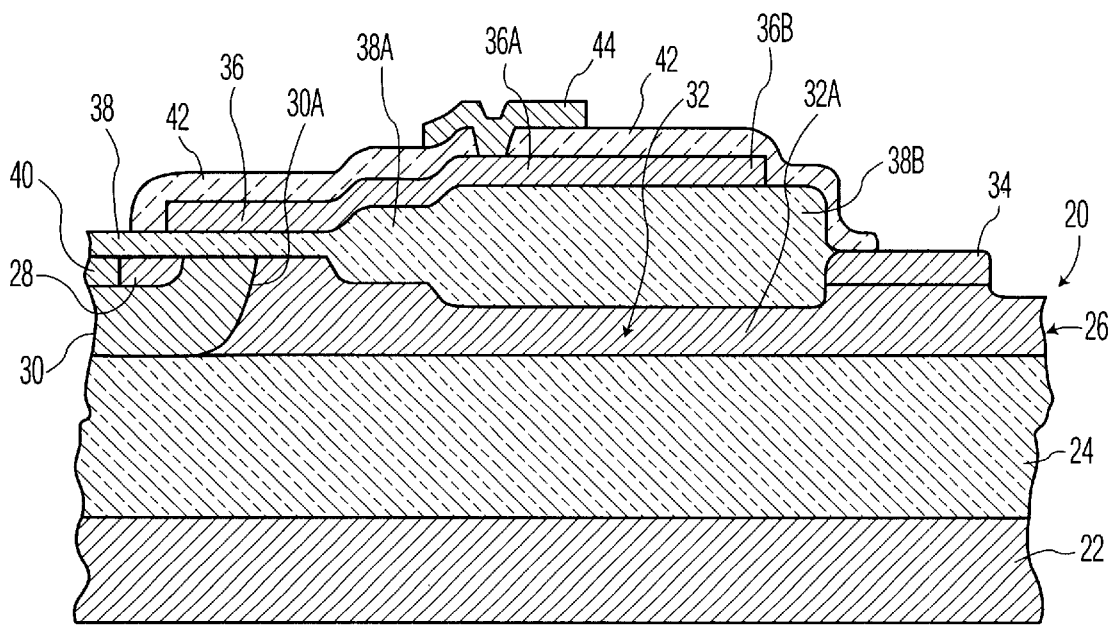
FIG. 1 shows a simplified cross-sectional view of a prior art lateral thin-film SOI device.

In the drawing, semiconductor regions having the same conductivity type are generally shown hatched in the same direction in the cross-sectional views, and it should be understood that the figures are not drawn to scale.

DESCRIPTION OF THE PREFERRED EMBODIMENTS

In the simplified cross-sectional view of FIG. 1, a lateral thin-film device, here an SOI MOS transistor 20, includes a semiconductor substrate 22, a buried insulating layer 24, and a semiconductor surface SOI layer 26 in which the device is fabricated. The MOS transistor includes a source region 28 of one conductivity type, a body region 30 of a second, opposite conductivity type, a lateral drift region 32 of the first conductivity type and a drain region 34, also of the first conductivity type. The basic simplified device structure is completed by a gate electrode 36, shown as completely insulated from the underlying semiconductor surface layer 26 by an oxide insulation region 38, although it will be recognized that for a JFET device, an electrical connection will be formed between the otherwise-insulated gate electrode and the underlying semiconductor gate region of the device. Within the scope of the invention, the MOS transistor which serves as the starting point for the present invention may have various performance-enhancing features, such as a stepped oxide region 38A, 38B, an extended gate electrode structure forming a field plate portion 36A, 36B, and a thinned lateral drift region portion 32A, all as detailed in the aforementioned prior art, or other performance-enhancing features as desired, without departing from the spirit or scope of the invention. Additionally, the MOS transistor 20 may also include a surface contact region 40, in contact with source region 28, located in the body region 30 and of the same conductivity type as the body region but more highly doped. The prior-art structure of FIG. 1 is completed by a dielectric layer 42, over which is provided a metal contact layer 44, here shown as contacting the gate electrode 36, typically of polysilicon, through an aperture in the dielectric layer 42. It is to be noted that in the prior-art device, the metal contact layer 44 is located entirely over the gate electrode 36, so that the metal contact layer 44 cannot serve as a field plate electrode with respect to the underlying portions of the device.

It will be understood that the simplified, representative devices shown in the figures depict particular device structures, but that wide variations in both device geometry and configuration can be used within the scope of the invention. Additionally, the present invention may be incorporated into various different types of high-voltage thin-layer SOI devices having different underlying structures well-known to those skilled in this art, such as LDMOS transistors, LIGB transistors and JFET devices.

Although the prior-art structure as described above in connection with FIG. 1 has generally good operating characteristics, it is still limited in terms of the maximum achievable breakdown voltage rating. This is because the maximum achievable breakdown voltage depends upon the thickness of the SOI layer and the thickness of both the buried insulating layer and the overlying or "top" insulation region. For a nominal breakdown voltage in the range of about 600–700 volts, the buried insulating layer will have a thickness of about 2–3 microns which, for optimum performance, will be balanced by an upper (field oxide) insulation region of approximately the same thickness. However, if still higher breakdown voltages are desired, either the thickness of the SOI layer must be decreased or the thickness of the insulation regions must be increased. Since decreasing the SOI layer thickness will severely degrade the on-state characteristics of the device, as a practical matter a further improvement in breakdown voltage requires that the thickness of the insulation regions be increased.

Increasing the thickness of the buried insulating layer to about 4–5 microns is achievable using known techniques, although cost constraints, manufacturing difficulties and thermal considerations presently limit the practical thickness to about this value. For optimal performance, the thickness of the buried insulation layer should be balanced or matched by a top insulation region such that at any lateral position along the SOI layer, the total thickness of insulating material (the dielectric layer plus the top insulation region, as discussed below) will result in a vertical electric field at the surface of the SOI layer which is about equal to or less than the vertical electric field at the bottom of the SOI layer adjacent the buried insulating layer. Using conventional materials for the various insulating and dielectric layers, as discussed below, will yield a structure in which the total thickness of the dielectric layer and the top insulation region is about equal to the thickness of the buried insulation layer. However, since the top insulation region is produced by thermal oxidation, there is a practical upper limit of about 2 microns to the thickness that can be achieved for this layer. This is because of the inherent physical limitations of the chemical process that controls thermal oxidation. As the oxidation thickness increases, a point of diminishing returns is reached such that increasing the oxidation time and/or temperature no longer results in a significant increase in oxide thickness. This phenomenon is known as the Deal-Grove oxidation rate law, and is well known to those of ordinary skill in the art. Thus, in order to achieve a thicker top insulation region, some other technique must be employed.

In the device structure of FIG. 2, such a thicker top insulation region is achieved in the relevant portion of the device, essentially that portion above the drain-side region of the drift region, by a structural variation at the upper surface of the device, as described below.

Figure 2:
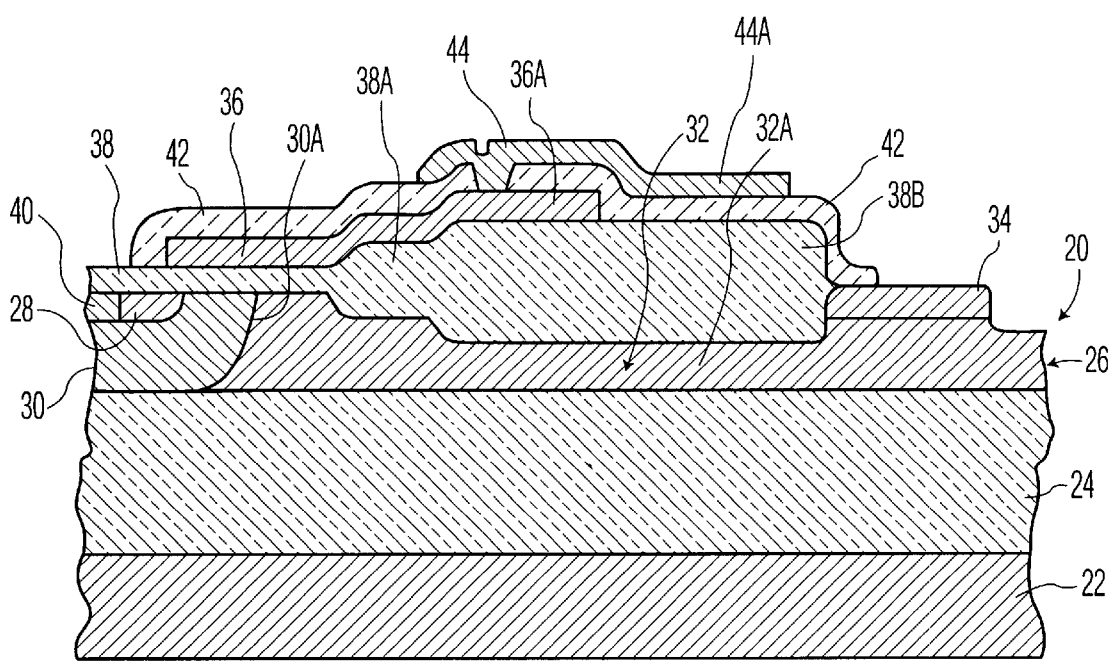
FIG. 2 shows a simplified cross-sectional view of a lateral thin-film SOI device in accordance with a preferred embodiment of the invention.

In the device shown in FIG. 2, the portion 36A, 36B of the extended gate electrode structure forming a field plate in FIG. 1 is shortened in the lateral direction, terminating above the central portion of the drift region 32, so that the gate electrode extends over about one half of the drift region rather than extending over most of the drift region as in FIG. 1. Dielectric layer 42 is provided over the gate electrode and the now-exposed portion of the top insulation region, at oxide region 38B. Dielectric layer 42 may advantageously be a deposited dielectric such as TEOS (Tetra Ethyl Ortho Silane) or silicon nitride.

In contrast to the prior-art configuration of FIG. 1, in the structure of FIG. 2 the gate electrode metal contact layer 44 does not stop short of the gate electrode 36, but rather extends laterally to the right as shown in FIG. 2 past the lateral termination of gate electrode 36, and steps down onto the dielectric layer 42 over the right-hand side of the top insulation region 38B over the right-hand side of the drift region 32. This extension of the gate electrode metal contact layer 44, designated as 44A in FIG. 2, serves to form a field plate electrode which enhances the high-voltage performance of the device.

In accordance with the invention, the provision of the dielectric layer 42 serves a two-fold purpose. First, it provides an upper insulating layer for the gate electrode 36, as in the prior art, and second, it serves to increase the total thickness of insulating material between the field plate electrode portion 44A and the underlying drift region 32. This in turn permits the underlying buried insulating layer 24 to be made thicker, while at the same time providing a total thickness of insulating material above the drift region which is approximately equal to thickness of insulating material below the drift region, thereby optimizing the device configuration for high-voltage operation in a manner which was not possible in the prior art, where the field plate was formed by an extension 36A of the gate electrode 36 extending over most of the drift region at a distance determined solely by the thickness of the thermal oxide. Since this thermal oxide is limited in terms of its maximum achievable thickness, as noted above, the most advantageous physical configuration, namely a thicker buried insulating layer and an upper insulation region having a total thickness approximately equal to that of the buried insulating layer, cannot be achieved.

While it will be recognized that many different configurations and alternatives are contemplated within the scope of the invention, the thickness of the buried insulation layer and the total thickness of the dielectric layer and the insulation region should each be at least above 2 microns, and preferably at least about 3 microns. Using presently-available technology, and taking into account practicalities such as cost constraints, manufacturing difficulties, and thermal considerations, the total insulation thickness above and below the drift region can be increased to about 4–5 microns each using current technology, although it will be recognized that the invention is expressly not limited to this thickness. It will also be recognized that since the insulation region 38, at its thickest portion 38B, can only be formed to a thickness of about 2 microns, in order to achieve the desired total thickness of the top insulation layer for a given application the remaining portion of the desired total thickness of the top insulation region will be formed from the dielectric layer 42.

Figure 3:
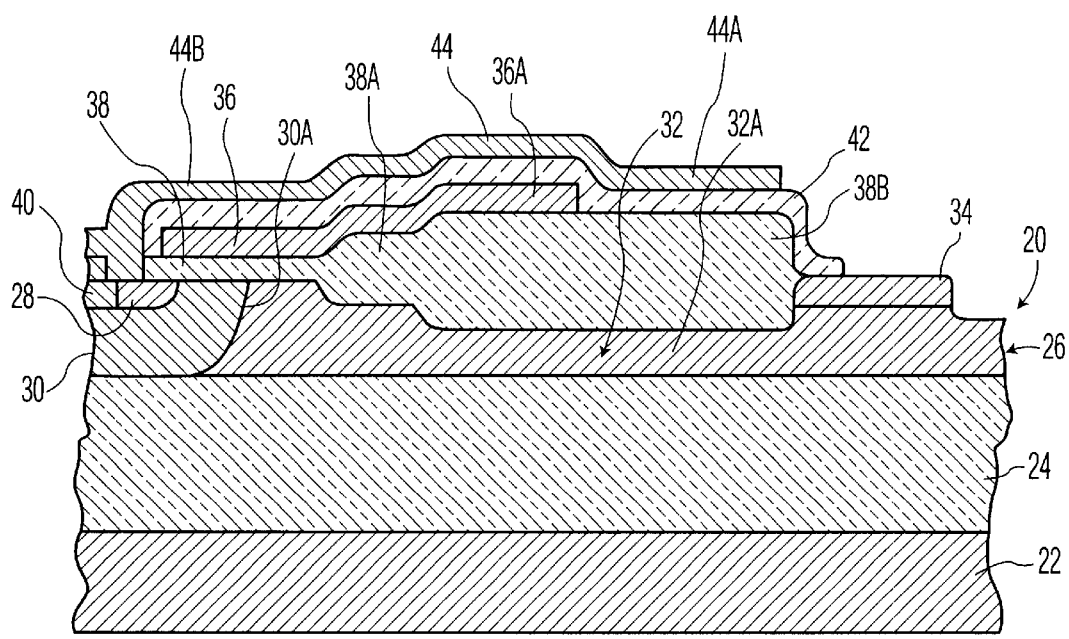
FIG. 3 shows a simplified cross-sectional view of a further preferred embodiment of a lateral thin-film SOI device in accordance with the invention.

Another application of the invention is shown in the simplified cross-sectional view of FIG. 3. Since the lower portion of the device structure shown in FIG. 3 is exactly the same as that of the device structure shown in FIG. 2, with like components being designated with like reference numerals, this portion of the device will not be described in further detail here. The structure of FIG. 3 differs from that shown in FIG. 2 in that the field plate electrode 44 extends not only to the right (44A) but also to the left (44B) and extends down to the SOI layer 26 through an aperture in the overlying layers to contact the source region 28 and surface contact region 40 rather than the gate electrode 36. This configuration has the additional advantage of reducing the Miller capacitance of the structure, and it is noted that this configuration, in which the gate electrode and field plate electrode are electrically independent, cannot be achieved in the prior-art structure of FIG. 1, wherein the field plate is an integral extension of the gate electrode and therefore cannot be electrically independent thereof.

In the foregoing manner, the present invention provides a transistor device structure capable of high performance in a high-voltage, high-current environment, while enhancing operating parameters and in particular breakdown voltage.

While the invention has been particularly shown and described with reference to several preferred embodiments thereof, it will be understood by those skilled in the art that various changes in form and detail may be made without departing from the spirit or scope of the invention. In this application it should be understood that the word "a" or "an" preceding an element does not exclude the presence of a plurality of such elements, and that the word "comprising" does not exclude the presence of other elements or steps than those described or claimed.

What is claimed is:

1. A lateral thin-film Silicon-On-Insulator (SOI) device comprising a semiconductor substrate, a buried insulating layer on said substrate, and a lateral transistor device in an SOI layer on said buried insulating layer and having a source region of a first conductivity type formed in a body region of a second conductivity type opposite to that of the first, a lateral drift region of said first conductivity type adjacent said body region, a drain region of said first conductivity type and laterally spaced apart from said body region by said lateral drift region, and a gate electrode over a part of said body region in which a channel region is formed during operation and extending over a part of said lateral drift region adjacent said body region, said gate electrode being at least substantially insulated from said body region and drift region by an insulation region, further comprising a dielectric layer over at least a part of said insulation region and said gate electrode, and a field plate electrode over at least a part of said dielectric layer which is in direct contact with said insulation region, said field plate electrode being connected to an electrode of said lateral transistor device.

2. A lateral thin-film Silicon-On-Insulator (SOI) device as in claim 1, wherein a total thickness of said dielectric layer and said insulation region is about equal to a thickness of said buried insulation layer.

3. A lateral thin-film Silicon-On-Insulator (SOI) device as in claim 2, wherein said total thickness and said thickness are each at least above about 2 microns.

4. A lateral thin-film Silicon-On-Insulator (SOI) device as in claim 2, wherein said gate electrode extends over about one half of said lateral drift region.

5. A lateral thin-film Silicon-On-Insulator (SOI) device as in claim 2, wherein said field plate electrode is connected to the gate electrode of said lateral transistor device.

6. A lateral thin-film Silicon-On-Insulator (SOI) device as in claim 2, wherein said field plate electrode is connected to the source electrode of said lateral transistor device.

7. A lateral thin-film Silicon-On-Insulator (SOI) device as in claim 2, wherein said gate electrode comprises polysilicon, said field plate electrode comprises metal, said insulation region comprises a thermal oxide and said dielectric layer comprises a deposited dielectric.

8. A lateral thin-film Silicon-On-Insulator (SOI) device as in claim 2, wherein said lateral transistor device comprises a LDMOS transistor.

9. A lateral thin-film Silicon-On-Insulator (SOI) device as in claim 2, wherein said lateral transistor device comprises an LIGB transistor.

10. A lateral thin-film Silicon-On-Insulator (SOI) device as in claim 2, wherein said lateral transistor device comprises a JFET.

11. A lateral thin-film Silicon-On-Insulator (SOI) device as in claim 1, wherein a total thickness of said dielectric layer and said insulation region and a thickness of said buried insulation layer are selected such that, at any lateral position along the SOI layer, a vertical electric field at the surface of the SOI layer will be about equal to or less than a vertical electric field at the bottom of the SOI layer adjacent to the buried insulting layer.

* * * * *